US012787833B2

(12) United States Patent
Uchida

(10) Patent No.: US 12,787,833 B2
(45) Date of Patent: Nov. 3, 2026

(54) INTERCONNECT SUBSTRATE, METHOD OF MAKING THE SAME, AND SEMICONDUCTOR APPARATUS

(71) Applicant: SHINKO ELECTRIC INDUSTRIES CO., LTD., Nagano (JP)

(72) Inventor: Kensuke Uchida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 379 days.

(21) Appl. No.: 18/542,996

(22) Filed: Dec. 18, 2023

(65) Prior Publication Data

US 2024/0222246 A1 Jul. 4, 2024

(30) Foreign Application Priority Data

Dec. 28, 2022 (JP) ................................ 2022-211175

(51) Int. Cl.
*H10W 70/685* (2026.01)
*H10W 20/00* (2026.01)
(Continued)

(52) U.S. Cl.
CPC ....... *H10W 70/685* (2026.01); *H10W 20/056* (2026.01); *H10W 70/098* (2026.01); *H10W 90/701* (2026.01); *H10W 72/232* (2026.01); *H10W 72/244* (2026.01); *H10W 72/321* (2026.01); *H10W 72/344* (2026.01)

(58) Field of Classification Search
CPC .......................... H10W 70/685; H10W 20/056
See application file for complete search history.

(56) References Cited

U.S. PATENT DOCUMENTS

2009/0020322 A1* 1/2009 Hsu ...................... H05K 3/3473 174/257
2013/0180772 A1 7/2013 Inoue et al.
(Continued)

FOREIGN PATENT DOCUMENTS

JP 2013-149948 8/2013
JP 2014-239200 12/2014
(Continued)

OTHER PUBLICATIONS

Wikipedia, Solder mask, Apr. 20, 2021 (Year: 2021).*
Office Action mailed on Jul. 28, 2026 with respect to the corresponding Japanese patent application No. 2022-211175.

*Primary Examiner* — Shih Tsun A Chou
(74) *Attorney, Agent, or Firm* — IPUSA, PLLC

(57) ABSTRACT

An interconnect substrate includes an interconnect layer, an insulating layer covering the interconnect layer, an electrode disposed on an upper surface of the interconnect layer and protruding from an upper surface of the insulating layer, and a groove formed in the upper surface of the insulating layer around the electrode, wherein the electrode includes a first portion whose side surface is covered with the insulating layer, a second portion whose entire side surface is located outside the insulating layer, the second portion being partially located inside the groove and partially protruding above the upper surface of the insulating layer, and a metal layer covering both an upper surface of the second portion and the entire side surface of the second portion.

17 Claims, 7 Drawing Sheets

(51) Int. Cl.

| | |
|---|---|
| ***H10W 70/05*** | (2026.01) |
| ***H10W 72/20*** | (2026.01) |
| ***H10W 72/30*** | (2026.01) |
| ***H10W 90/00*** | (2026.01) |

(56) References Cited

U.S. PATENT DOCUMENTS

| | | | | |
|---|---|---|---|---|
| 2014/0328039 | A1* | 11/2014 | Koep .................. | H05K 3/3421 361/767 |
| 2014/0363927 | A1 | 12/2014 | Hurwitz et al. | |
| 2015/0287688 | A1* | 10/2015 | Lin ...................... | H10W 72/20 257/738 |
| 2016/0005685 | A1* | 1/2016 | Rokugawa .......... | H10W 70/635 174/251 |
| 2017/0141023 | A1 | 5/2017 | Arisaka et al. | |

FOREIGN PATENT DOCUMENTS

| | | |
|---|---|---|
| JP | 2016-018806 | 2/2016 |
| JP | 2017-098306 | 6/2017 |

* cited by examiner

INTERCONNECT SUBSTRATE, METHOD OF MAKING THE SAME, AND SEMICONDUCTOR APPARATUS

CROSS-REFERENCE TO RELATED APPLICATIONS

The present application is based on and claims priority to Japanese Patent Application No. 2022-211175 filed on Dec. 28, 2022, with the Japanese Patent Office, the entire contents of which are incorporated herein by reference.

FIELD

The disclosures herein relate to interconnect substrates, methods of making an interconnect substrate, and semiconductor apparatuses.

BACKGROUND

Some interconnect substrates as known in the art are configured to have a semiconductor chip mounted thereon. Such an interconnect substrate may have an electrode protruding from an insulating layer for connection to the semiconductor chip and a metal layer covering the upper surface and side surface of a protruding portion of the electrode protruding from the insulating layer. When mounting the semiconductor chip on the interconnect substrate, the metal layer covering the electrode and a connection terminal of the semiconductor chip are connected by solder, for example (See Patent Document 1, for example).

Adhesion between the lower surface of the metal layer and the upper surface of the insulating layer is low, so that a gap may be formed at the interface between the metal layer and the insulating layer. When a gap is formed at the interface between the metal layer and the insulating layer, the solder may enter the gap when the semiconductor chip is connected to the electrode, which creates a risk of causing the solder to form an alloy with the metal constituting the electrode. When the solder and the electrode are alloyed, voids are formed in the vicinity of the alloyed portion, degrading the reliability of connection between the interconnect substrate and the semiconductor chip.

Accordingly, there may be a need to provide an interconnect substrate configured to improve the reliability of connection with a semiconductor chip.

RELATED ART DOCUMENT

Patent Document

[Patent Document 1] Japanese Laid-open Patent Publication No. 2016-18806

SUMMARY

According to an aspect of the embodiment, an interconnect substrate includes an interconnect layer, an insulating layer covering the interconnect layer, an electrode disposed on an upper surface of the interconnect layer and protruding from an upper surface of the insulating layer, and a groove formed in the upper surface of the insulating layer around the electrode, wherein the electrode includes a first portion whose side surface is covered with the insulating layer, a second portion whose entire side surface is located outside the insulating layer, the second portion being partially located inside the groove and partially protruding above the upper surface of the insulating layer, and a metal layer covering both an upper surface of the second portion and the entire side surface of the second portion.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1A:
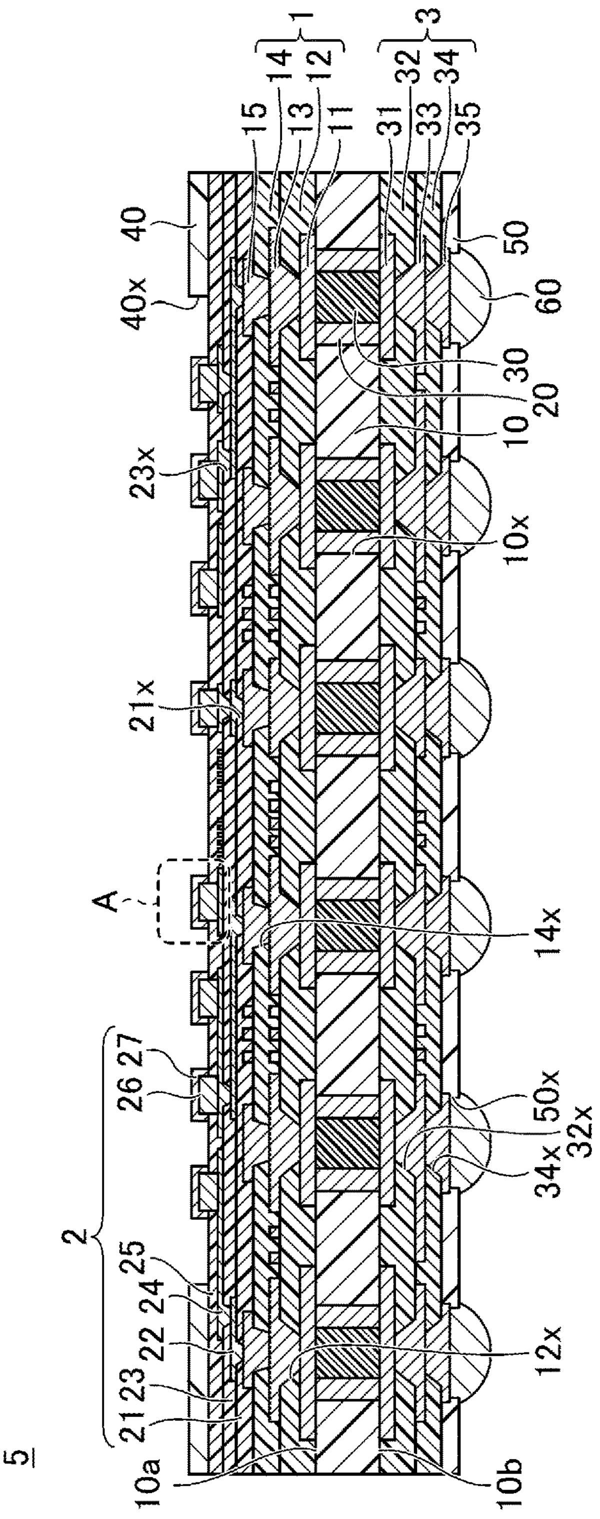
FIGS. 1A and 1B are cross-sectional views illustrating an interconnect substrate according to a first embodiment.

In the following, embodiments for carrying out the invention will be described with reference to the accompanying drawings. In these drawings, the same components are referred to by the same reference numerals, and duplicate descriptions thereof may be omitted.

FIRST EMBODIMENT

Structure of Interconnect Substrate

Figure 1B:
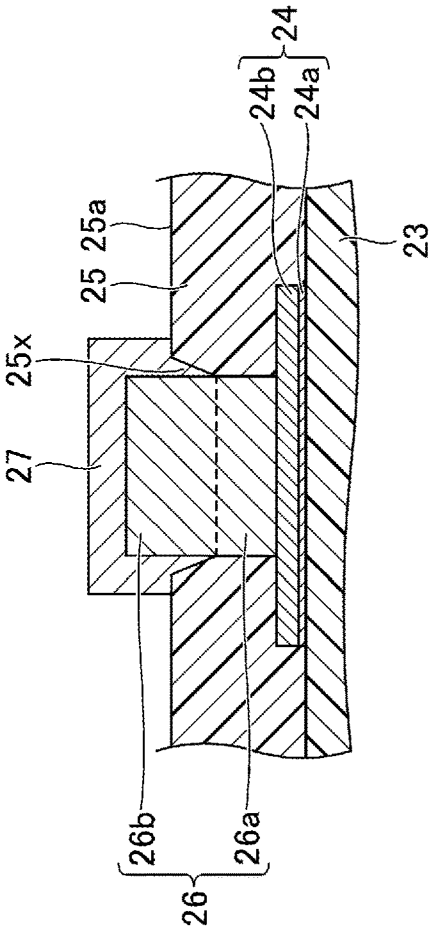

FIGS. 1A and 1B are cross-sectional views illustrating an interconnect substrate according to a first embodiment. FIG. 1A is an overall view, and FIG. 1B is an enlarged view of part A of FIG. 1A.

Referring to FIGS. 1A and 1B, an interconnect substrate 5 includes a core substrate 10, a first interconnect structure 1, a second interconnect structure 2, a third interconnect structure 3, solder resist layers 40 and 50, and external connection terminals 60. The first interconnect structure 1 and the second interconnect structure 2 are disposed on the first side of the core substrate 10, and the third interconnect structure 3 is disposed on the second side of the core substrate 10. The solder resist layers 40 and 50 and the external connection terminals 60 may optionally be provided according to need.

In this embodiment, for the sake of convenience, the same side of the interconnect substrate 5 as the solder resist layer 40 in FIG. 1 is referred to as an upper side or a first side, and the same side as the solder resist layer 50 is referred to a lower side or a second side. Further, the surface of an object on the upper side thereof is referred to as a first surface or an upper surface, and the surface of an object on the lower side thereof is referred to as a second surface or a lower surface. It may be noted, however, that the interconnect substrate 5 maybe positioned upside down when used, or may be arranged at any angle. A plane view refers to a view of an object as seen along the direction normal to the first surface of the solder resist layer 40, and a plane shape refers to the shape of an object as seen along the direction normal to the first surface of the solder resist layer 40.

The core substrate 10 maybe, for example, a glass epoxy substrate or the like made by impregnating a glass cloth with a thermosetting insulating resin such as an epoxy-based resin or the like. The core substrate 10 may alternatively be a substrate or the like made by impregnating a woven or nonwoven fabric of glass fiber, carbon fiber, aramid fiber, or the like with a thermosetting insulating resin such as an epoxy-based resin or the like. The thickness of the core substrate 10 maybe, for example, about 80 to 1200 μm. The glass cloth and the like are not shown in the figures.

A plurality of through-holes 10*x* extending through the core substrate 10 are formed in the core substrate 10. The plane shape of the through-holes 10*x* may be, for example, circular with a diameter of about 50 to 100 μm. The pitch of the through-holes 10*x* may be, for example, about 100 to 1000 μm. A through-electrode 20 is formed on the inner wall surface of each through-hole 10*x*, and a resin part 30 fills the center space (inside the through-electrode 20) of the through-hole 10*x*. Copper (Cu) or the like, for example, may be used as a material of the through-electrodes 20. A thermosetting insulating resin such as an epoxy-based resin, for example, may be used as a material of the resin parts 30.

The first interconnect structure 1 is laminated on a first surface 10*a* of the core substrate 10. The first interconnect structure 1 is an interconnect structure made by laminating a plurality of first interconnect layers and a plurality of first insulating layers. In this embodiment, the plurality of first interconnect layers include a first interconnect layer 11, a first interconnect layer 13, and a first interconnect layer 15. The first interconnect layer 15 is the uppermost first interconnect layer closest to the second interconnect structure 2 among the plurality of first interconnect layers. The number of first interconnect layers is not limited to the example of this embodiment. Provision of only one first interconnect layer may suffice. In this embodiment, the plurality of first insulating layers include a first insulating layer 12 and a first insulating layer 14. The first insulating layer 14 is the uppermost first insulating layer closest to the second interconnect structure 2 among the plurality of first insulating layers. The number of first insulating layer is not limited to the example of this embodiment. Provision of only one first insulating layer may suffice.

The third interconnect structure 3 is laminated on a second surface 10*b* of the core substrate 10. The third interconnect structure 3 is an interconnect structure made by laminating a plurality of third interconnect layers and a plurality of third insulating layers. In this embodiment, the plurality of third interconnect layers include a third interconnect layer 31, a third interconnect layer 33, and a third interconnect layer 35. The number of third interconnect layers is not limited to the example of this embodiment. In this embodiment, the plurality of third insulating layers includes a third insulating layer 32 and a third insulating layer 34. The number of third insulating layers is not limited to the example of this embodiment.

The first interconnect layer 11 is an interconnect pattern formed on the first surface 10*a* of the core substrate 10. The third interconnect layer 31 is an interconnect pattern formed on the second surface 10*b* of the core substrate 10. The first interconnect layer 11 is electrically connected to the third interconnect layer 31 through the through electrodes 20 extending through the core substrate 10. The first interconnect layer 11 and the third interconnect layer 31 are made of, for example, a metal foil such as a copper foil or a plating layer such as a copper plating layer. The thicknesses of the first interconnect layer 11 and the third interconnect layer 31 maybe, for example, about 15 to 35 μm. The line width and space of the first interconnect layer 11 and the third interconnect layer 31 maybe, for example, about 10 μm and 10 μm, respectively, to 50 μm and 50 μm, respectively.

The line width in the phrase "line width and space" represents the width of interconnect lines, and the space represents the interval between adjacent interconnect lines (i.e., interconnect spacing). For example, when the line width and space are described as 10 μm and 10 μm, respectively, to 50 μm and 50 μm, respectively, the width of interconnect lines is 10 μm to 50 μm, and the interval between adjacent interconnect lines is 10 μm to 50 μm. It is not necessary to make the line width equal to the line interval.

The first insulating layer 12 is structured to cover the first interconnect layer 11 on the first surface 10*a* of the core substrate 10. The third insulating layer 32 is structured to cover the third interconnect layer 31 on the second surface 10*b* of the core substrate 10. The first insulating layer 12 and the third insulating layer 32 are mainly composed of non-photosensitive resin. The first insulating layer 12 and the third insulating layer 32 maybe mainly composed of a thermosetting non-photosensitive resin such as an epoxy-based resin, an imide-based resin, a phenol-based resin, or a cyanate-based resin. The thicknesses of the first insulating layer 12 and the third insulating layer 32 maybe, for example, about 20 to 40 μm. The first insulating layer 12 and the third insulating layer 32 may contain a filler such as silica ($SiO_2$).

The first interconnect layer 13 is formed on the first side of the first insulating layer 12 and is electrically connected to the first interconnect layer 11. The first interconnect layer 13 includes a via interconnect filling a via hole 12*x* that extends through the first insulating layer 12 to expose the first surface of the first interconnect layer 11, and also includes an interconnect pattern formed on the first surface of the first insulating layer 12. The via hole 12*x* may be an inverted truncated conical recess in which the diameter of the top opening toward the first insulating layer 14 is larger than the diameter of the bottom opening at the upper surface of the first interconnect layer 11.

The third interconnect layer 33 is formed on the second side of the third insulating layer 32 and is electrically connected to the third interconnect layer 31. The third interconnect layer 33 includes a via interconnect filling a via hole 32*x* that extends through the third insulating layer 32 to expose the second surface of the third interconnect layer 31, and also includes an interconnect pattern formed on the second surface of the third insulating layer 32. The via hole 32*x* may be a truncated conical recess in which the diameter of the opening toward the third insulating layer 34 is larger than the diameter of the opening at the lower surface of the third interconnect layer 31.

The diameters of the openings of the via holes 12*x* and 32*x* may be, for example, about 50 to 60 μm. The material of the first interconnect layer 13 and the third interconnect layer 33 maybe, for example, copper or the like. The thicknesses of the interconnect patterns of the first interconnect layer 13 and the third interconnect layer 33 maybe, for example, about 15 to 25 μm. The line width and space of the interconnect patterns of the first interconnect layer 13 and the third interconnect layer 33 maybe, for example, about 10 μm and 10 μm, respectively, to 50 μm and 50 μm, respectively.

The first insulating layer 14 is structured to cover the first interconnect layer 13 on the first surface of the first insulating layer 12. The third insulating layer 34 is structured to cover the third interconnect layer 33 on the second surface of the third insulating layer 32. The materials and thicknesses of the first insulating layer 14 and the third insulating layer 34 maybe, for example, substantially the same as those of the first insulating layer 12 and the third insulating layer 32. The first insulating layer 14 and the third insulating layer 34 may contain a filler such as silica ($SiO_2$).

The first interconnect layer 15 is formed on the first side of the first insulating layer 14 and is electrically connected to the first interconnect layer 13. The first interconnect layer 15 includes a via interconnect filling a via hole 14*x* that extends through the first insulating layer 14 to expose the first surface of the first interconnect layer 13, and also includes an interconnect pattern formed on the first surface of the first insulating layer 14. The via hole 14*x* may be an inverted truncated conical recess in which the diameter of the top opening toward the second insulating layer 21 is larger than the diameter of the bottom opening at the upper surface of the first interconnect layer 13.

The third interconnect layer 35 is formed on the second side of the third insulating layer 34 and is electrically connected to the third interconnect layer 33. The third interconnect layer 35 includes a via interconnect filling a via hole 34*x* that extends through the third insulating layer 34 to expose the second surface of the third interconnect layer 33, and also includes an interconnect pattern formed on the second surface of the third insulating layer 34. The via hole 34*x* may be a truncated conical recess in which the diameter of the opening toward the solder resist layer 50 is larger than the diameter of the opening at the lower surface of the third interconnect layer 33.

The diameter of the openings of the via holes 14*x* and 34*x* may be, for example, about 50 to 60 μm. The materials of the first interconnect layer 15 and the third interconnect layer 35, the thicknesses of the interconnect patterns of the first interconnect layer 15 and the third interconnect layer 35, and the line widths and spaces of the interconnect patterns of the first interconnect layer 15 and the third interconnect layer 35 maybe, for example, substantially the same as those of the first interconnect layer 13 and the third interconnect layer 33.

The second interconnect structure 2 is arranged on the first interconnect structure 1. The second interconnect structure 2 is an interconnect structure made by laminating a plurality of second interconnect layers and a plurality of second insulating layers and by forming electrodes connected to the uppermost second interconnect layer. In this embodiment, the plurality of second interconnect layers include a second interconnect layer 22 and a second interconnect layer 24. The second interconnect layer 22 is the bottommost second interconnect layer that is disposed closest to the first interconnect structure 1 among the plurality of second interconnect layers. The second interconnect layer 24 is the topmost second interconnect layer that is disposed farthest away from the first interconnect structure 1 among the plurality of second interconnect layers. The number of second interconnect layers is not limited to the example of this embodiment. Provision of only one second interconnect layer may suffice.

In this embodiment, the plurality of second insulating layers include a second insulating layer 21, a second insulating layer 23, and a second insulating layer 25. The second insulating layer 21 is the bottommost second insulating layer that is disposed closest to the first interconnect structure 1 among the plurality of second insulating layers. The number of second insulating layers is not limited to the example of this embodiment. Provision of only one second insulating layer may suffice.

The line width and line spacing of the second interconnect layers are smaller than the line width and line spacing of the first interconnect layers. The line width and line spacing of the second interconnect layers are smaller than the line width and line spacing of the third interconnect layers. That is, the second interconnect layers belonging to the second interconnect structure 2 is fine interconnect layers having higher interconnect density than the first interconnect layers belonging to the first interconnect structure 1 and the third interconnect layers belonging to the third interconnect structure 3.

The second insulating layer 21 is structured to cover the first interconnect layer 15 on the first surface of the first insulating layer 14. The second insulating layer 21 is an insulating layer mainly composed of a non-photosensitive resin. The second insulating layer 21 maybe mainly composed of a thermosetting non-photosensitive resin such as an epoxy-based resin, an imide-based resin, a phenol-based resin, or a cyanate-based resin. The second insulating layer 21 may contain a filler such as silica ($SiO_2$). The second insulating layer 21 is a thinner insulating layer than the first insulating layers 12 and 14. The thickness of the second insulating layer 21 maybe, for example, about 10 to 20 μm.

The second interconnect layer 22 is formed on the first side of the second insulating layer 21 and is electrically connected to the first interconnect layer 15 of the first interconnect structure 1. The second interconnect layer 22 includes a via interconnect filling a via hole 21*x* that extends through the second insulating layer 21 to expose the first surface of the first interconnect layer 15, and also includes an interconnect pattern formed on the first surface of the second insulating layer 21. The via hole 21*x* may be an inverted truncated conical recess in which the diameter of the top opening toward the second insulating layer 23 is larger than the diameter of the bottom opening at the upper surface of the first interconnect layer 15. The diameters of the openings of the via hole 21*x* may be, for example, about 5 to 10 μm. Copper or the like, for example, may be used as the material of the second interconnect layer 22. The thickness of the interconnect pattern belonging to the second interconnect layer 22 maybe, for example, about 5 to 10 μm. The line width and space of the interconnect pattern belonging to the second interconnect layer 22 maybe, for example, about 3 μm and 3 μm, respectively, to 8 μm and 8 μm, respectively.

The second insulating layer 23 is structured to cover the second interconnect layer 22 on the first surface of the second insulating layer 21. The material and thickness of the second insulating layer 23 maybe, for example, substantially the same as those of the second insulating layer 21. The second insulating layer 23 may contain a filler such as silica ($SiO_2$).

The second interconnect layer 24 is formed on the first side of the second insulating layer 23 and is electrically connected to the second interconnect layer 22. The second interconnect layer 24 includes a via interconnect filling a via hole 23*x* that extends through the second insulating layer 23 to expose the first surface of the second interconnect layer 22, and also includes an interconnect pattern formed on the first surface of the second insulating layer 23. The via hole 23*x* may be an inverted truncated conical recess in which the diameter of the top opening toward the second insulating layer 25 is larger than the diameter of the bottom opening at the upper surface of the second interconnect layer 22. The diameters of the openings of the via hole 23*x* may be, for example, about 5 to 10 μm. The material of the second interconnect layer 24, the thickness of the interconnect pattern belonging to the second interconnect layer 24, and the line width and space of the interconnect pattern belonging to the second interconnect layer 24 maybe, for example, substantially the same as those of the second interconnect layer 22. The second interconnect layer 24 maybe a structure including, for example, a seed layer 24*a* and an electroplating layer 24*b* formed on the seed layer 24*a*.

The second insulating layer 25 is structured to cover the second interconnect layer 24 on the first surface of the second insulating layer 23. The material and thickness of the second insulating layer 25 maybe, for example, substantially the same as those of the second insulating layer 23. The second insulating layer 25 may contain a filler such as silica ($SiO_2$).

An electrode 26 is provided on the upper surface of the second interconnect layer 24 and partially protrudes from an upper surface 25*a* of the second insulating layer 25. As illustrated in FIG. 1B, a groove 25*x* is provided in the upper surface 25*a* of the second insulating layer 25 around the electrode 26. The groove 25*x* is recessed in the upper surface 25*a* of the second insulating layer 25 to extend toward the second interconnect layer 24. The groove 25*x* is formed by removing a portion of the second insulating layer 25. The groove 25*x* may have a ring shape, for example, around the electrode 26 in a plan view. The groove 25*x* is widest at the upper surface 25*a* of the second insulating layer 25 and gradually narrows toward the second interconnect layer 24.

The width of the groove 25*x* at the upper surface 25*a* of the second insulating layer 25 maybe, for example, about greater than or equal to 1 μm and less than or equal to 5 μm. The depth of the groove 25*x* from the upper surface 25*a* of the second insulating layer 25 maybe, for example, about greater than or equal to 1 μm and less than or equal to 10 μm. The width and depth of the groove 25*x* may not be constant in the circumferential direction of the electrode 26. For example, a portion of the groove 25*x* illustrated on the right-hand side of the electrode 26 in the cross-sectional view of FIG. 1B and another portion thereof illustrated on the left-hand side may differ in the width of the groove 25*x* at the upper surface 25*a* of the second insulating layer 25, or may differ in the depth of the groove 25*x* from the upper surface 25*a* of the second insulating layer 25.

The electrode 26 includes a first portion 26*a* situated closer to the second interconnect layer 24 than the groove 25*x* and having a side surface covered with the second insulating layer, and also includes a second portion 26*b* extending upward from the first portion 26*a*. The side surface of the second portion 26*b* is not covered with the second insulating layer 25. Part of the second portion 26*b* is situated inside the groove 25*x*, and the other part protrudes from the upper surface 25*a* of the second insulating layer 25. That is, the former part of the second portion 26*b* is situated below the upper surface 25*a* of the second insulating layer 25, and the latter part of the second portion 26*b* is situated above the upper surface 25*a* of the second insulating layer 25.

In FIG. 1B, a dashed line is used to indicate the boundary between the first portion 26*a* and the second portion 26*b* for the sake of convenience, but these two portions are actually seamless. The boundary between the first portion 26*a* and the second portion 26*b* is situated between the upper surface of the second interconnect layer 24 and the upper surface 25*a* of the second insulating layer 25 in the thickness direction of the interconnect substrate 5.

The material of the electrode 26 maybe, for example, substantially the same as that of the second interconnect layer 22. The overall thickness of the electrode 26 maybe, for example, about 10 to 20 μm. The thickness of the portion of the electrode 26 located above the upper surface 25*a* of the second insulating layer 25 maybe, for example, about 0.1 to 18 μm. The plane shape of the electrode 26 maybe, for example, circular with a diameter of about 20 to 30 μm. The pitch of electrodes 26 maybe, for example, about 40 to 50 μm.

The interconnect substrate 5 has a metal layer 27 electrically in contact with the electrode 26. The electrode 26 and the metal layer 27 constitute an external connection terminal for electrical connection to a semiconductor chip. The metal layer 27 covers the upper surface of the second portion 26*b* and the side surface of the second portion 26*b*. The side surface of the second portion 26*b* includes both a portion situated above the upper surface 25*a* of the second insulating layer 25 and a portion situated inside the groove 25*x*.

The metal layer 27 may include only one layer or may be a multilayer laminated structure. Examples of the metal layer 27 include an Au layer, an Ni/Au layer (i.e., a metal layer made by laminating an Ni layer and an Au layer in this order), an Ni/Pd/Au layer (i.e., a metal layer made by laminating an Ni layer, a Pd layer, and an Au layer in this order), and the like. In the metal layer 27, the thickness of the Ni layer may be, for example, about 1 μm to 10 μm. The thickness of the Pd layer may be, for example, about 0.01 μm to 0.5 μm. The thickness of the Au layer may be, for example, about 0.01 μm to 0.5 μm.

The metal layer 27 maybe such that an Ni alloy layer, a Pd alloy layer, or an Au alloy layer is used in place of the Ni layer, the Pd layer, or the Au layer, respectively. In the metal layer 27, a Co layer may be used in place of the Ni layer. In this case, the thickness range of the Co layer may be substantially the same as that of the Ni layer. A Co alloy layer may be used in place of the Ni layer. In this case, the thickness range of the Co alloy layer may be substantially the same as that of the Ni layer.

In the case in which the metal layer 27 has a multilayered structure including any one of an Ni layer, an Ni alloy layer, a Co layer, and a Co alloy layer, the groove 25*x* is mainly filled with the Ni layer, the Ni alloy layer, the Co layer, or the Co alloy layer. When the thickness of the Ni layer, the Ni alloy layer, the Co layer, or the Co alloy layer is greater than or equal to the width of the groove 25*x*, the noted layer may sufficiently fill the groove 25*x*. Because of this, the metal layer 27 preferably includes a nickel layer, a nickel alloy layer, a cobalt layer, or a cobalt alloy layer.

The solder resist layer 40 is the outermost insulating layer formed on the outer perimeter area of the first surface of the second insulating layer 25 of the second interconnect structure 2. The material of the solder resist layer 40 maybe, for example, a photosensitive insulating resin mainly composed of a phenol-based resin, a polyimide-based resin, or the like. The solder resist layer 40 may contain a filler such as silica ($SiO_2$). The solder resist layer 40 has an opening 40*x*, and the electrodes 26 are exposed in the opening 40*x*.

The solder resist layer 50 is the outermost insulating layer structured to cover the third interconnect layer 35 of the third interconnect structure 3 on the second surface of the third insulating layer 34 of the third interconnect structure 3. The material of the solder resist layer 50 maybe, for example, a photosensitive insulating resin mainly composed of a phenol-based resin, a polyimide-based resin, or the like. The solder resist layer 50 may contain a filler such as silica ($SiO_2$).

The solder resist layer 50 has an opening 50*x*, and part of the third interconnect layer 35 of the third interconnect structure 3 is situated at the end of the opening 50*x*. On the third interconnect layer 35 situated in the opening 50*x*, an external connection terminal 60 such as a solder ball is disposed according to need.

As was described heretofore, the interconnect substrate 5 is provided with the groove 25*x* that is recessed in the upper surface 25*a* of the second insulating layer 25 to extend toward the second interconnect layer 24, and the metal layer 27 extends into the groove 25*x* to cover the side surface of the electrode 26. The advantageous results of this structure will be described along with a comparative example.

Figure 2A:
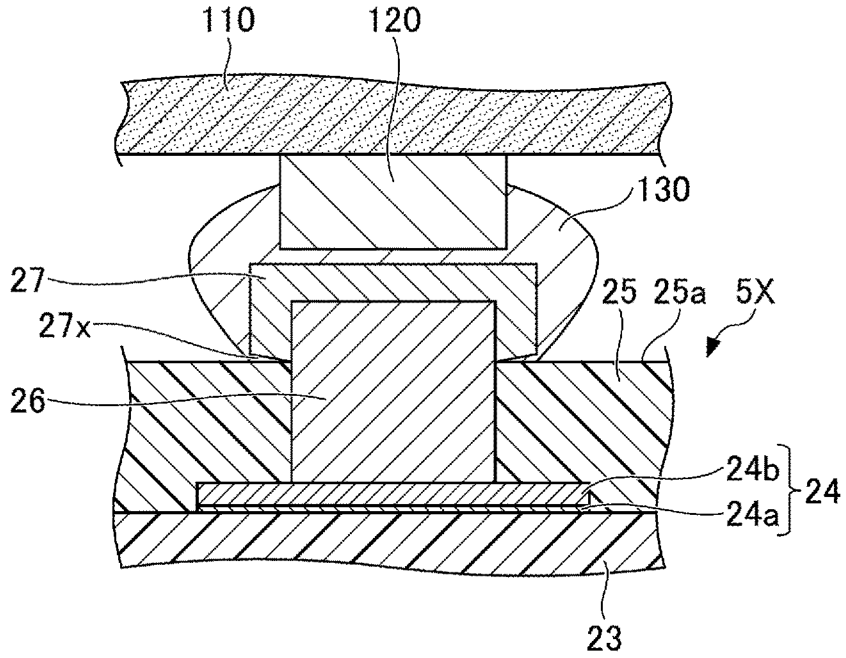
FIGS. 2A and 2B are drawings illustrating drawings illustrating the advantageous results of the interconnect substrate according to the first embodiment.
Figure 2B:
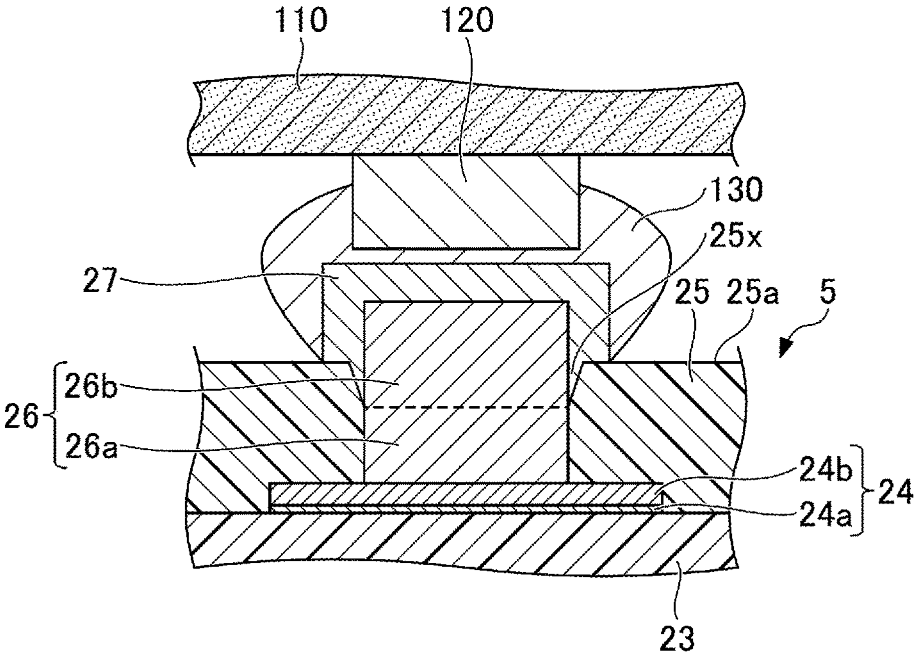

FIGS. 2A and 2B are drawings illustrating the advantageous results of the interconnect substrate according to the first embodiment, and illustrate the structure in which an electrode post 120 of a semiconductor chip 110 is connected to the electrode 26 and metal layer 27 of the interconnect substrate 5 or 5X through a solder 130.

FIG. 2A illustrates a connection between the interconnect substrate 5X and the semiconductor chip 110 according to a comparative example. As illustrated in FIG. 2A, the interconnect substrate 5X does not have a groove 25*x* around the electrode 26. In the interconnect substrate 5X, a gap 27*x* is formed between the lower surface of the metal layer 27 and the upper surface 25*a* of the second insulating layer 25. The gap 27*x* has an annular shape situated around the electrode 26, for example. The gap 27*x* is formed due to a low adhesion between the lower surface of the metal layer 27 and the upper surface 25*a* of the second insulating layer 25.

The occurrence of the gap 27*x* as in the interconnect substrate 5X creates a risk that the solder 130 enters the gap 27*x* to come into contact with the side surface of the electrode 26 to form an alloy when the semiconductor chip 110 is connected. The formation of an alloy of the solder 130 and the electrode 26 results in a void being formed in the vicinity of the alloyed portion, which reduces the reliability of connection between the interconnect substrate 5X and the semiconductor chip 110.

FIG. 2B illustrates a connection between the interconnect substrate 5 and the semiconductor chip 110 according to the first embodiment. As illustrated in FIG. 2B, the interconnect substrate 5 has the groove 25*x* that is recessed in the upper surface 25*a* of the second insulating layer 25 to extend toward the second interconnect layer 24, and the metal layer 27 extends into the groove 25*x* to cover the side surface of the electrode 26. The metal layer 27 and the electrode 26 are both metals, and are thus sufficiently adhered to each other.

With this arrangement, even if a gap similar to FIG. 2A is formed between the lower surface of the metal layer 27 and the upper surface 25*a* of the second insulating layer 25 around the groove 25*x*, the provision of the metal layer 27 extending into the groove 25*x* to cover the side surface of the electrode 26 reduces the risk of the solder 130 coming into contact with the side surface of the electrode 26. This also reduces the risk that a void is created by formation of an alloy. That is, the interconnect substrate 5 enables the improvement of the reliability of connection with the semiconductor chip 110.

The metal layer 27 preferably fills the groove 25*x*. This increases the distance between the side surface of the electrode 26 and the solder 130, thereby further reducing the risk of the solder 130 coming into contact with the side surface of the electrode 26.

Method of Making Interconnect Substrate

In the following, a method of making the interconnect substrate according to the first embodiment will be described. FIG. 3 through FIG. 6 illustrate the steps of making the interconnect substrate according to the first embodiment. It may be noted that the steps of making the interconnect substrate 5 will be described with reference to the drawings that illustrate the area of the interconnect substrate 5 surrounded by the broken line A in FIG. 1A.

Figure 3A:
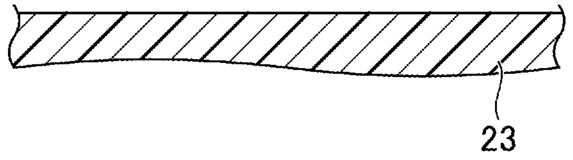
FIGS. 3A through 3D are drawings illustrating the steps of making the interconnect substrate according to the first embodiment.
Figure 3B:
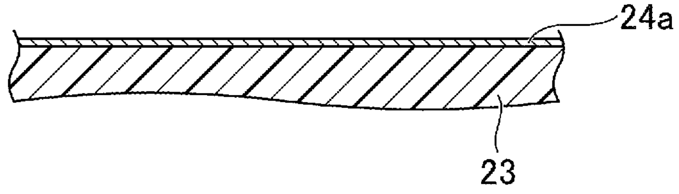

The step illustrated in FIG. 3A corresponds to the state in which the interconnect substrate 5 has been partly made by a well-known buildup process or the like and which is observed before the formation of the second interconnect layer 24, the second insulating layer 25, the electrodes 26, and the metal layer 27. FIG. 3A illustrates only the second insulating layer 23. In the step illustrated in FIG. 3B, a seed layer 24*a* is formed on the upper surface of the second insulating layer 23 by electroless plating of copper or sputtering of copper. The thickness of the seed layer 24*a* may be, for example, about 200 to 400 nm.

Figure 3C:
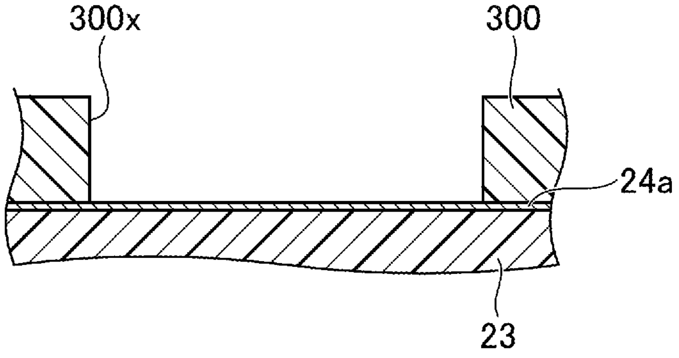

In the step illustrated in FIG. 3C, a plating resist pattern 300 having an opening 300*x* corresponding to the shape of the interconnect pattern of the second interconnect layer 24 is formed on the seed layer 24*a*. The plating resist pattern 300 may be made, for example, by attaching a photosensitive dry film resist to the seed layer 24*a*. The opening 300*x* may be formed, for example, by exposing and developing the photosensitive dry film resist. A portion of the upper surface of the seed layer 24*a* is exposed in the opening 300*x*.

Figure 3D:
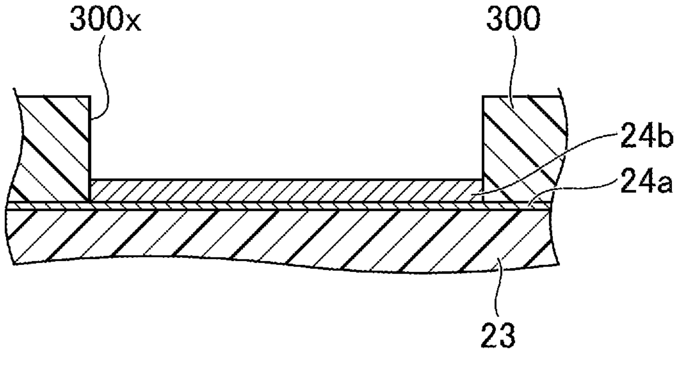

In the step illustrated in FIG. 3D, an electrolytic plating layer 24*b* is deposited on the seed layer 24*a* exposed in the opening 300*x* of the plating resist pattern 300 by electrolytic plating of copper using the seed layer 24*a* as a power feeding layer. In the step illustrated in FIG. 4A, the plating resist pattern 300 is removed by using a plating-resist stripper solution.

In the steps illustrated in FIG. 4B through FIG. 5A, an electrode 26 is formed. Specifically, in the step illustrated in FIG. 4B, a plating resist pattern 310 having an opening 310*x* corresponding to the shape of the electrode 26 is formed on the seed layer 24*a* and the electrolytic plating layer 24*b*. The plating resist pattern 310 may be formed, for example, by attaching a photosensitive dry film resist to both the seed layer 24*a* and the electrolytic plating layer 24*b*. The opening 310*x* may be made, for example, by exposing and developing the photosensitive dry film resist. Part of the upper surface of the electroplating layer 24*b* is exposed in the opening 310*x*. That is, the diameter of the opening 310*x* is smaller than the diameter of the opening 300*x*.

Figure 4A:
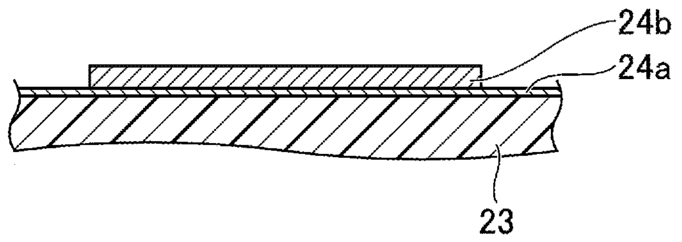
FIGS. 4A through 4C are drawings illustrate the steps of making the interconnect substrate according to the first embodiment.
Figure 4B:
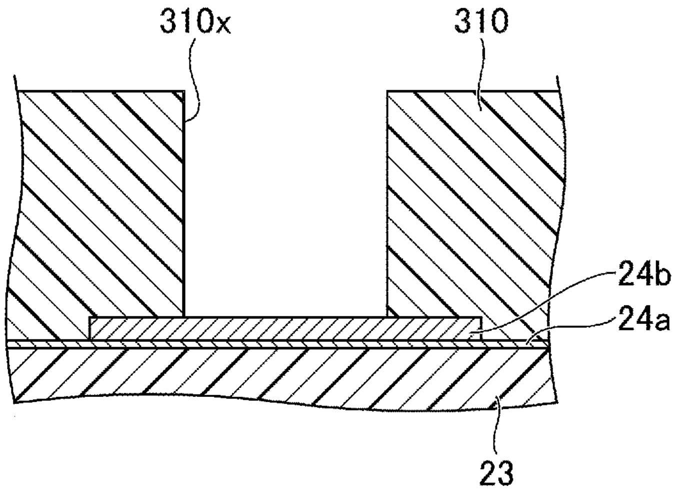
Figure 4C:
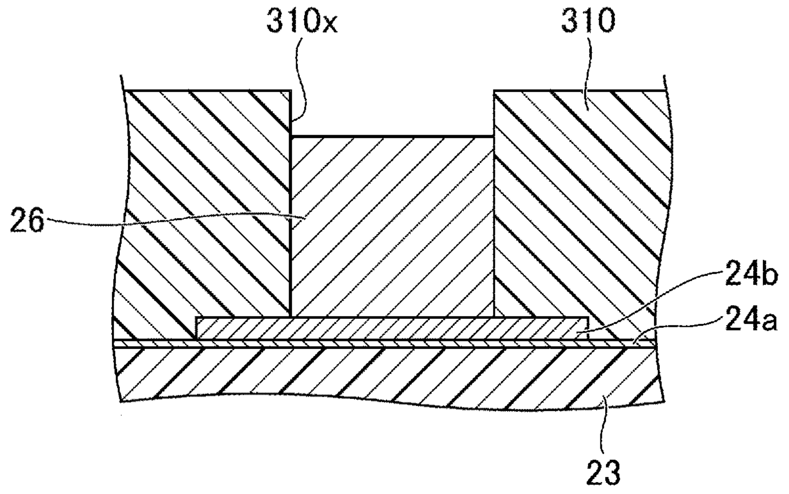

In the step illustrated in FIG. 4C, the electrode 26 is deposited on the electrolytic plating layer 24*b* exposed in the opening 310*x* of the plating resist pattern 310 by electrolytic plating of copper using the seed layer 24*a* as a power feeding layer. In the step illustrated in FIG. 5A, the plating resist pattern 310 is removed by using a plating-resist stripper solution. Through these steps, the electrode 26 is formed.

Figure 5A:
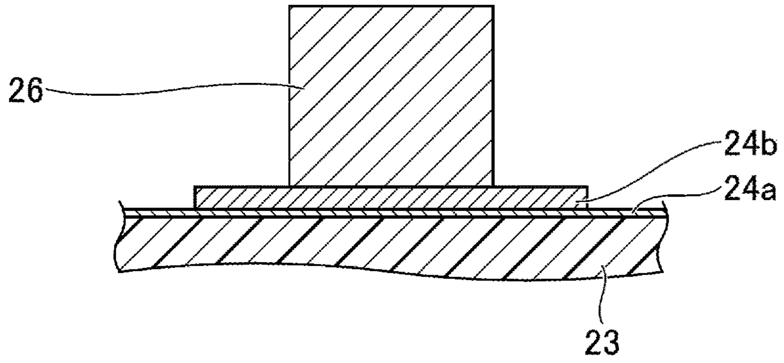
FIGS. 5A through 5C are drawings illustrating the steps of making the interconnect substrate according to the first embodiment.
Figure 5B:
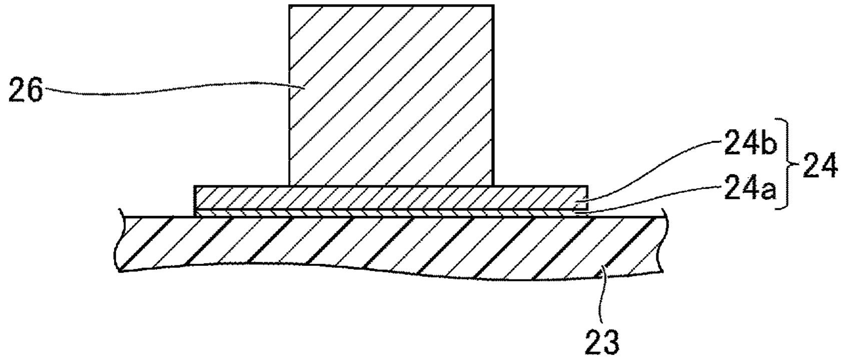

In the step illustrated in FIG. 5B, etching is performed using the electrolytic plating layer 24*b* as a mask to remove the seed layer 24*a* exposed beyond the electrolytic plating layer 24*b*, thereby forming a second interconnect layer 24. In the case of the seed layer 24*a* being copper, an aqueous solution obtained by mixing a sulfuric acid and a hydrogen peroxide, an aqueous sodium persulfate solution, an aqueous ammonium persulfate solution, or the like, for example, may be used as the etching solution.

Figure 5C:
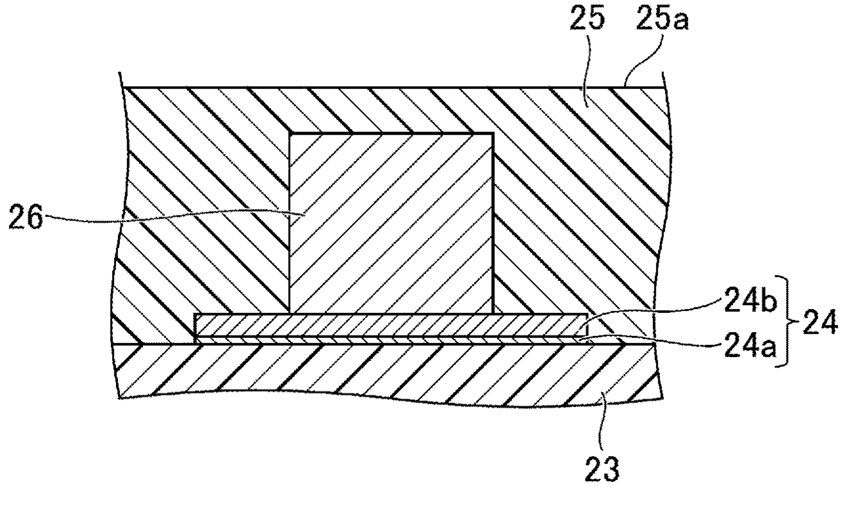

In the step illustrated in FIG. 5C, a second insulating layer 25 covering the upper and side surfaces of the electrode 26 and covering the second interconnect layer 24 is formed on the second insulating layer 23. Specifically, a semi-cured epoxy-based resin film or the like, for example, is laminated on the second insulating layer 23 so as to cover the second interconnect layer 24 and the electrode 26, and is then cured to form the second insulating layer 25. Alternatively, instead of using an epoxy-based resin film or the like, epoxy-based resin liquid or paste or the like may be applied, and is then cured to form the second insulating layer 25.

Figure 6A:
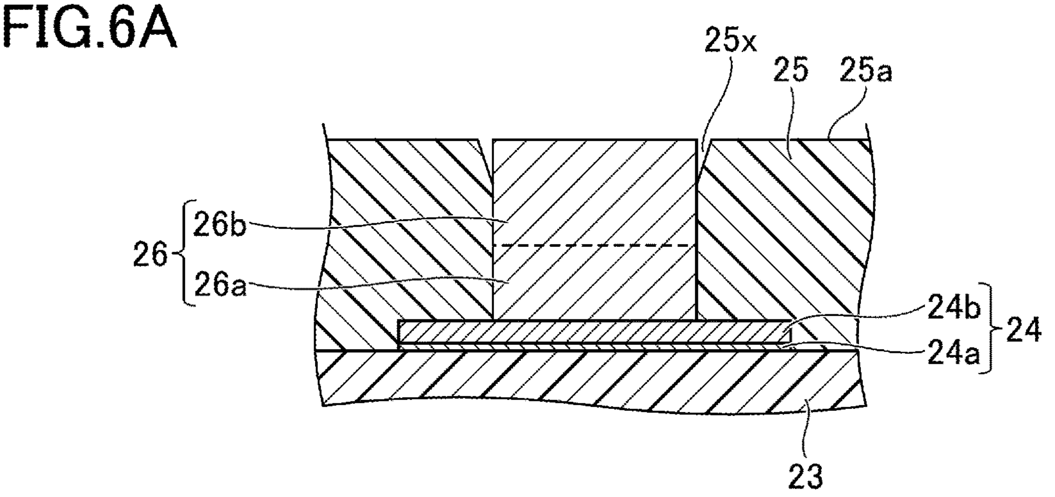
FIGS. 6A through 6C are drawings illustrating the steps of making the interconnect substrate according to the first embodiment.

In the step illustrated in FIG. 6A, the upper surface 25*a* of the second insulating layer 25 is polished to expose the upper surface of the electrode 26 at the upper surface 25*a* of the second insulating layer 25, and a groove 25*x* recessed from the upper surface 25*a* of the second insulating layer 25 toward the second interconnect layer 24 is provided in the upper surface 25*a* of the second insulating layer 25 around the electrode 26. The polishing of the second insulating layer 25 maybe performed, for example, by chemical mechanical polishing (CMP). The upper surface 25*a* of the second insulating layer 25 and the upper surface of the electrode 26 are, for example, flush with each other. The pressure and duration of chemical mechanical polishing would typically be adjusted such as to prevent a groove from being formed at the interface between the second insulating layer 25 and the electrode 26. In the present application, however, chemical mechanical polishing is performed under the condition that results in the formation of the groove 25*x* at the interface between the second insulating layer 25 and the electrode 26.

Specifically, the groove 25*x* may be formed at the interface between the second insulating layer 25 and the electrode 26 by using a higher than normal pressure and a shorter than normal duration with respect to the chemical mechanical polishing. In order to form a groove 25*x* with an appropriate width and depth, the pressure of chemical mechanical polishing is preferably greater than or equal to 10 kPa and less than or equal to 30 kPa, and the duration of polishing is preferably greater than or equal to 1 minute and less than or equal to 15 minutes. It may be noted that the appropriate width and depth of the groove 25*x* have already been described in connection with the interconnect substrate 5.

Figure 6B:
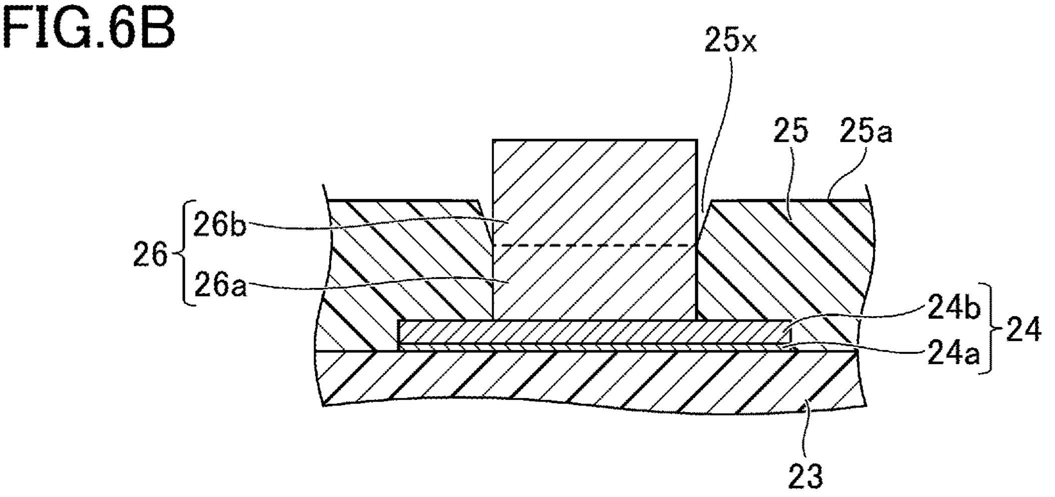

In the step illustrated in FIG. 6B, the upper surface 25*a* of the second insulating layer 25 is etched, which results in the electrode 26 having identifiable portions, i.e., the first portion 26*a*, which is situated closer to the second interconnect layer 24 than the groove 25*x* and which has the side surface covered with the second insulating layer 25, and the second portion 26*b*, which extends upward from the first portion 26*a*. The second portion 26*b*, which has the side surface thereof exposed outside the second insulating layer 25, is partly situated inside the groove 25*x* and partly protrudes above the upper surface 25*a* of the second insulating layer 25. Etching of the second insulating layer 25 is performed, for example, by dry etching. A plasma etching apparatus may be used for dry etching. Fluorine-based gas such as $CF_4$ gas and oxygen gas may be used for dry etching.

Figure 6C:
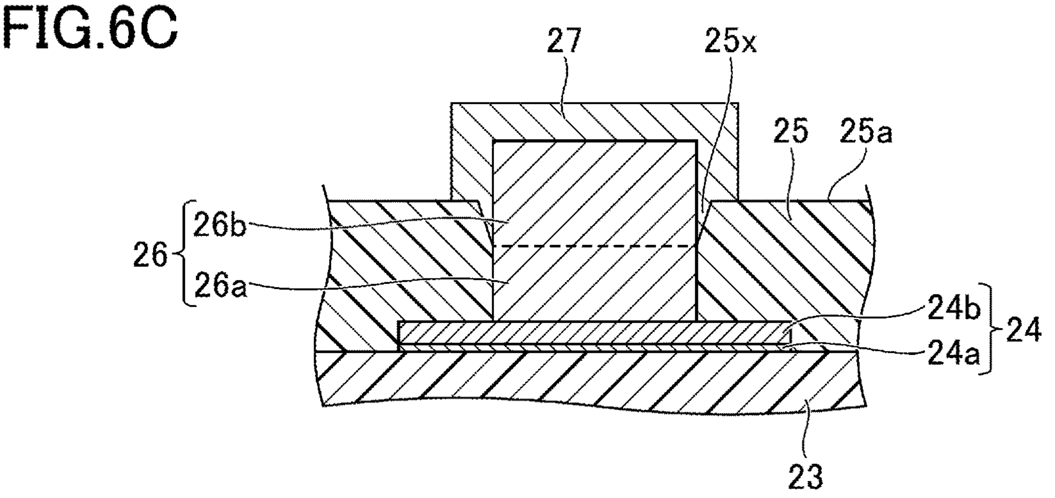

In the step illustrated in FIG. 6C, a metal layer 27 electrically connected to the electrode 26 is formed. Specifically, the metal layer 27 covering the upper surface of the second portion 26*b* and the side surface of the second portion 26*b* is formed by, for example, electroless plating. The material of the metal layer 27 has already been described. Preferably, the metal layer 27 fills the groove 25*x*.

Example of Application of First Embodiment

The example of application of the first embodiment described in the following is directed to an example of a semiconductor apparatus in which a semiconductor chip is mounted on an interconnect substrate. With respect to the example of application of the first embodiment, the description of the same components as those of the previously described embodiment may be omitted.

Figure 7:
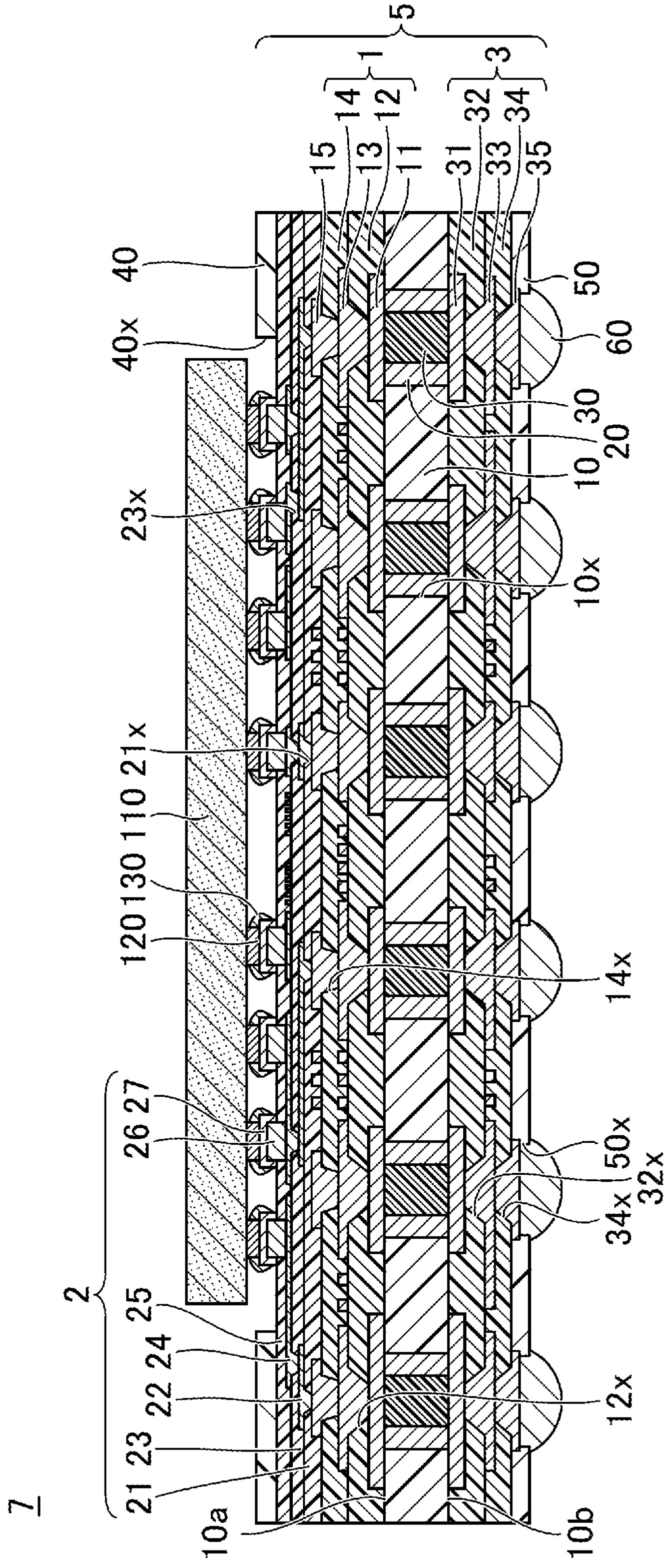
FIG. 7 is a cross-sectional view illustrating a semiconductor apparatus according to an example of application of the first embodiment.

FIG. 7 is a cross-sectional view illustrating a semiconductor apparatus according to the example of application of the first embodiment. Referring to FIG. 7, a semiconductor apparatus 7 includes the interconnect substrate 5 illustrated in FIG. 1, a semiconductor chip 110, an electrode post 120, and a solder 130.

The semiconductor chip 110 includes, for example, a semiconductor integrated circuit (not shown) or the like formed on a thinned semiconductor substrate (not shown) made of silicon or the like. The electrode post 120, which is electrically connected to the semiconductor integrated circuit (not shown), is formed on the semiconductor substrate (not shown). The electrode post 120 is a connection terminal connected to the interconnect substrate 5, and is a copper post, for example.

A plurality of electrode posts 120 are electrically connected through the solder 130 to the respective external connection terminals of the interconnect substrate 5, each of which includes the electrode 26 and the metal layer 27. In the actual semiconductor apparatus 7, which slightly differs from what is illustrated in FIG. 7, the solder 130 is disposed between the electrode post 120 and the metal layer 27 (on the electrodes 26) in substantially the same manner as in FIG. 2. The material of the solder 130 may be, for example, an alloy containing Pb, an alloy of Sn and Cu, an alloy of Sn and Ag, an alloy of Sn, Ag and Cu, or the like. An underfill resin may fill the gap between the semiconductor chip 110 and the upper surface of the interconnect substrate 5.

As was described above, a semiconductor chip may be mounted on the interconnect substrate 5 according to the first embodiment to make the semiconductor apparatus 7. Although not illustrated in FIG. 7, the semiconductor apparatus 7 is configured such that, as illustrated in FIG. 1B, the metal layer 27 extends into the groove 25*x* to cover the side surface of the electrode 26. This arrangement serves to improve the reliability of connection between the interconnect substrate 5 and the semiconductor chip 110.

Although the preferred embodiments have heretofore been described in detail, the present invention is not limited to the above-described embodiments, and various variations and substitutions may be made to the above-described embodiments without departing from the scope defined in the claims.

For example, the present invention may be applicable to an interconnect substrate having a different structure from that illustrated in FIG. 1 as long as the interconnect substrate has an electrode protruding from an insulating layer and a metal layer covering the upper surface and side surface of the electrode, with the electrode and the metal layer serving as external connection terminal. An example of such an interconnect substrate to which the present invention may be applicable is a coreless interconnect substrate having a first interconnect structure and a second interconnect structure laminated thereon, without having either a core substrate or a third interconnect structure.

According to at least one of the disclosed technology, an interconnect substrate is provided that is configured to improve the reliability of connection with a semiconductor chip.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The present disclosures non-exhaustively include the subject matter set out in the following clauses:

Clause 1. A method of making an interconnect substrate, comprising:
- forming an electrode on an upper surface of an interconnect layer;
- forming an insulating layer covering both the electrode and the interconnect layer;
- polishing an upper surface of the insulating layer to expose an upper surface of the electrode at the upper surface of the insulating layer and also to form a groove in the upper surface of the insulating layer around the electrode;
- etching the upper surface of the insulating layer to cause the electrode to have a first portion and a second portion, the first portion having a side surface thereof covered with the insulating layer, the second portion having an entire side surface thereof located outside the insulating layer, the second portion being partially located inside the groove and partially protruding above the upper surface of the insulating layer; and
- forming a metal layer covering both an upper surface of the second portion and the entire side surface of the second portion.

Clause 2. The method of making an interconnect substrate as claimed in clause 1, wherein the polishing the upper surface of the insulating layer involves chemical mechanical polishing.

Clause 3. The method of making an interconnect substrate as claimed in clause 1, wherein the etching the upper surface of the insulating layer involves dry etching.

What is claimed is:

1. An interconnect substrate comprising:
- an interconnect layer;
- an insulating layer covering the interconnect layer;
- an electrode disposed on an upper surface of the interconnect layer and protruding from an upper surface of the insulating layer, the electrode being a single seamless structure; and
- a groove formed in the upper surface of the insulating layer around the electrode,
- wherein the electrode includes:
- a first portion whose side surface is covered with the insulating layer;
- a second portion whose entire side surface is located outside the insulating layer, the second portion being partially located inside the groove and partially protruding above the upper surface of the insulating layer; and
- a metal layer covering both an upper surface of the second portion and the entire side surface of the second portion.

2. The interconnect substrate as claimed in claim 1, wherein the metal layer includes a nickel layer, a nickel alloy layer, a cobalt layer, or a cobalt alloy layer.

3. The interconnect substrate as claimed in claim 1, wherein the electrode and the metal layer constitute an external connection terminal for electrical connection to a semiconductor chip.

4. A semiconductor apparatus comprising:
- the interconnect substrate of claim 3; and
- the semiconductor chip mounted on the interconnect substrate,
- wherein the external connection terminal and a connection terminal of the semiconductor chip are electrically connected to each other through solder.

5. The interconnect substrate as claimed in claim 1, wherein the groove narrows downwardly.

6. The interconnect substrate as claimed in claim 1, wherein the groove has a ring shape in plan view.

7. The interconnect substrate as claimed in claim 1, wherein the metal layer has a portion in contact with a wall of the groove.

8. The interconnect substrate as claimed in claim 1, wherein the electrode is made of copper.

9. The interconnect substrate as claimed in claim 1, wherein a plane shape of the electrode is circular.

10. An interconnect substrate comprising:
- an interconnect layer;
- an insulating layer covering the interconnect layer;
- an electrode disposed on an upper surface of the interconnect layer and protruding from an upper surface of the insulating layer; and
- a groove formed in the upper surface of the insulating layer around the electrode,
- wherein the electrode includes:
- a first portion whose side surface is covered with the insulating layer;
- a second portion whose entire side surface is located outside the insulating layer, the second portion being partially located inside the groove and partially protruding above the upper surface of the insulating layer; and
- a metal layer covering both an upper surface of the second portion and the entire side surface of the second portion,
- wherein the metal layer fills the groove.

11. The interconnect substrate as claimed in claim 10, wherein the metal layer includes a nickel layer, a nickel alloy layer, a cobalt layer, or a cobalt alloy layer.

12. The interconnect substrate as claimed in claim 10, wherein the electrode and the metal layer constitute an external connection terminal for electrical connection to a semiconductor chip.

13. The interconnect substrate as claimed in claim 10, wherein the groove narrows downwardly.

14. The interconnect substrate as claimed in claim 10, wherein the groove has a ring shape in plan view.

15. The interconnect substrate as claimed in claim 10, wherein the metal layer has a portion in contact with a wall of the groove.

16. The interconnect substrate as claimed in claim 10, wherein the electrode is made of copper.

17. The interconnect substrate as claimed in claim 10, wherein a plane shape of the electrode is circular.

* * * * *